United States Patent [19]

Maeda et al.

[11] Patent Number: 5,223,078
[45] Date of Patent: Jun. 29, 1993

[54] CONICAL PORTION GROWTH CONTROL METHOD AND APPARATUS

[75] Inventors: Akiho Maeda, Takehu; Atsushi Ozaki, Annaka, both of Japan

[73] Assignee: Shin-Etsu Handotai Company, Limited, Tokyo, Japan

[21] Appl. No.: 776,774

[22] Filed: Oct. 15, 1991

[30] Foreign Application Priority Data

Oct. 12, 1990 [JP] Japan .................................. 2-274124

[51] Int. Cl.$^5$ ............................................. C30B 15/28
[52] U.S. Cl. ..................................... 156/601; 156/600; 156/617.1; 156/618.1; 156/619.1; 156/620.4; 422/249
[58] Field of Search ...................... 156/600, 601, 617.1, 156/618.1, 619.1, 620.4, 620.41; 422/249

[56] References Cited

U.S. PATENT DOCUMENTS

| | | | |
|---|---|---|---|
| 3,761,692 | 9/1973 | Cope | 156/601 |
| 3,958,129 | 5/1976 | Clement et al. | 156/601 |
| 4,008,387 | 2/1977 | Green et al. | 156/601 |
| 4,258,003 | 3/1981 | Hurle et al. | 156/601 |
| 4,710,258 | 12/1987 | Latka | 156/601 |
| 4,794,263 | 12/1988 | Katsuoka et al. | 156/601 |
| 4,926,357 | 5/1990 | Katsuoka et al. | 156/601 |
| 5,089,238 | 2/1992 | Araki et al. | 156/617.1 |
| 5,096,677 | 3/1992 | Katsuoka et al. | 156/601 |

FOREIGN PATENT DOCUMENTS 0285943 10/1988 European Pat. Off. .
0294311 12/1988 European Pat. Off. .
0429839 6/1991 European Pat. Off. .

OTHER PUBLICATIONS

IBM Technical Disclosure Bulletin, vol. 19, No. 3, Aug. 1976, pp. 869–870, N.Y.
Patent Abstracts of Japan, vol. 10, No. 23, Jan. 29, 1986.

Primary Examiner—Robert Kunemund
Assistant Examiner—Felisa Garrett
Attorney, Agent, or Firm—Browdy and Neimark

[57] ABSTRACT

A conical portion growth control method and an apparatus used in the method grow a conical portion 32B of a single crystal rod 32 by pulling the crystal rod from a melt 16 heated by a heater 14 in the Czochralski method, and aim to enhance reproducibility of the shape of the conical portion 32B and shorten the conical portion 32B. The control method has the steps of presetting a target value pattern 66 of the temperature of a concave portion 46 formed on a heat-insulating material 18 and a target value pattern 64 of the diameter change rate of a growing portion of the crystal rod, measuring the diameter of the crystal growing portion, calculating the change rate of the diameter, measuring the temperature of the concave portion, correcting the target temperature based on a difference between the calculated value and the target value of the diameter change rate, and controlling the amount of electricity supplied to the heater so that the measured temperature becomes equal to the corrected target temperature.

5 Claims, 5 Drawing Sheets

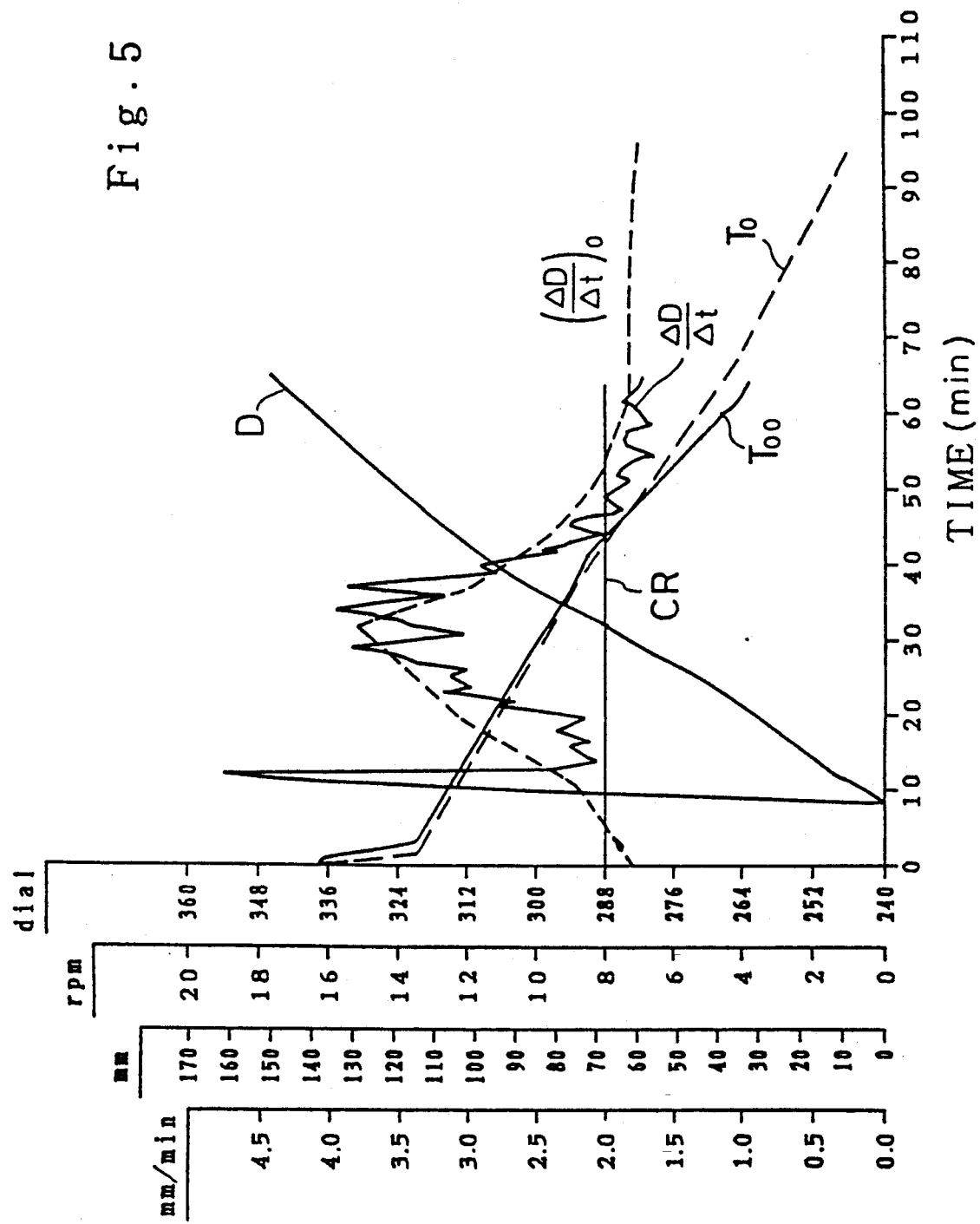

CONICAL PORTION GROWTH CONTROL METHOD AND APPARATUS

BACKGROUND OF THE INVENTION

1. Field of the Invention

The present invention relates to a conical portion growth control method which grows a conical portion of a single crystal rod by pulling up the crystal rod from a melt by using the Czochralski method and to an apparatus for use in the control method.

2. Description of the Related Art

In this kind of conical portion growth control method, a single crystal is grown by soaking a seed crystal having a diameter of approximately 10 mm in a melt and pulling up the seed crystal from the melt. In other words, after dislocations are eliminated by shortening the growing diameter of the seed crystal to approximately 3 mm, the diameter of the crystal is increased so as to grow a desired cylindrical body portion.

Since the diameter increasing portion (conical portion) of the crystal is not used as a product, it is necessary to make the length as small as possible so as to reduce costs of producing the single crystal. However, if the conical portion is too short, that is, if the crystal diameter is rapidly increased, the atoms of the crystal are disarranged and the body portion cannot be grown as single crystal.

The crystal diameter is increased by lowering the temperature related to the melt or by reducing the crystal pull-up speed. Although response in the crystal diameter to the change in the crystal pull-up speed is even prompter than response in the crystal diameter to the change in the temperature related to the melt, the atoms of the crystal are likely to be disarranged in the case where the change in the crystal pull-up speed is used to control the diameter. On the other hand, if a desired shape of the conical portion is set, the crystal diameter is measured and electricity to be supplied to a heater for heating the melt is controlled so as to obtain the desired shape, a large amount of hunting occurs and thus the surface of the crystal is made uneven. It is necessary to prevent the atoms of the crystal from being disarranged by making the slope of the desired shape gentler than a slope ideal for making the conical portion as short as possible. In short, the conical portion is longer than necessary.

Conventionally, a target temperature pattern in which the temperature of a melt falls with the passage of time is set, and the amount of electricity supplied to a heater for heating the melt is controlled so that the temperature related to the melt reaches the desired temperature. Since the amount of hunting is small in this control method, the surface of the crystal is not so uneven.

However, since the shape of the conical portion also depends upon the diameter of a narrow portion of the crystal, a target diameter of the body portion, the crystal pull-up speed, the rotation speed of a pulling shaft, the rotation speed of a crucible, the vertical position of the crucible with respect to the heater, the inner diameter of the crucible, the amount of a melt in the crucible and so on, it is difficult to obtain the shape of a conical portion having high reproducibility. Therefore, in order to prevent the disarranging of the atoms of the crystal, it is necessary to make the slope of a target temperature pattern with respect to the elapsed time gentler than an ideal slope of the temperature pattern for making the conical portion as short as possible. As a result, the conical portion is longer than necessary.

SUMMARY OF THE INVENTION

An object of the present invention is to provide a conical portion growth control method capable of shortening a conical portion while enhancing the reproducibility of the shape of the conical portion, and an apparatus for use in the method.

A conical portion growth control method of the present invention which grows a conical portion of a single crystal rod by pulling the crystal rod from a melt heated by a heater in the Czochralski method comprises the steps of presetting a target value (T0 or T0+$\Delta$T0) of the temperature related to the melt and a target value of the diameter change rate of a growing portion of the crystal rod, measuring the diameter of the crystal growing portion, calculating the change rate of the diameter, measuring the temperature related to the melt, correcting the target temperature based on a difference between the calculated value and the target value of the diameter change rate, and controlling the amount of electricity supplied to the heater so that the measured temperature becomes equal to the corrected target temperature.

A conical portion growth control apparatus of the present invention which grows a conical portion of a single crystal rod by pulling the crystal rod from a melt heated by a heater in the Czochralski method comprises a means for measuring the diameter of a growing portion of the crystal rod, a means for calculating the change rate of the diameter, a first setting means in which a target value of the change rate of the diameter is set, a means for measuring the temperature related to the melt, a second setting means in which a target value of the temperature related to the melt is set, a target temperature correction means for correcting the target temperature based on a difference between the calculated value and the target value of the diameter change rate, and a heater electricity control means for controlling the amount of electricity supplied to the heater so that the measured temperature becomes equal to the corrected target temperature.

In the above method and apparatus of the present invention, although the target values of the temperature and the diameter change rate each are set as a function of time, the pull-up length or the diameter, it is most preferable to set a target value of the diameter change rate as a function of the diameter in order to improve the reproducibility of the shape of the conical portion. This improvement in reproducibility then makes it sufficient for a function of time, which is the simplest of the above functions, to be set as a target value of the temperature.

The above temperature is, for example, the temperature of a concave portion formed on a heat insulating material which surrounds the heater, or the surface temperature of the melt.

The correction of the target temperature is preferably carried out by adding the total value of a proportional component, a differential component and an integral component concerning the difference between the calculated value and the target value of the diameter change rate to the target temperature.

Furthermore, the amount of electricity is controlled by, for example, performing a PID action with respect to the difference between the measured temperature and the corrected target temperature.

In the present invention, since the crystal diameter is not directly controlled, a control operation is performed so that the temperature related to the melt becomes equal to a target temperature T0 and the target temperature T0 is corrected based on a difference between the diameter change rate $\Delta D/\Delta t$ and a target diameter change rate $(\Delta D/\Delta t)0$ instead of the diameter itself, it is possible to improve the reproducibility of the shape of a conical portion, and thus to make the conical portion shorter than the conventional one without disarranging the atoms of the crystal.

BRIEF DESCRIPTION OF THE DRAWINGS

FIGS. 1 to 5 each show an embodiment of conical portion growth control method and apparatus according to the present invention.

FIG. 1 is a schematic view showing the construction of a crystal growing apparatus to which the conical portion growth control apparatus is applied;

FIG. 2 is a flow chart showing the procedures of a microcomputer 50 shown in FIG. 1; and FIGS. 3 to 5 are diagrams showing the results of the actual use of the embodiment of the conical portion growth control apparatus.

DESCRIPTION OF THE PREFERRED EMBODIMENT

An embodiment of the present invention will now be described with reference to the accompanying drawings.

Figure 1:
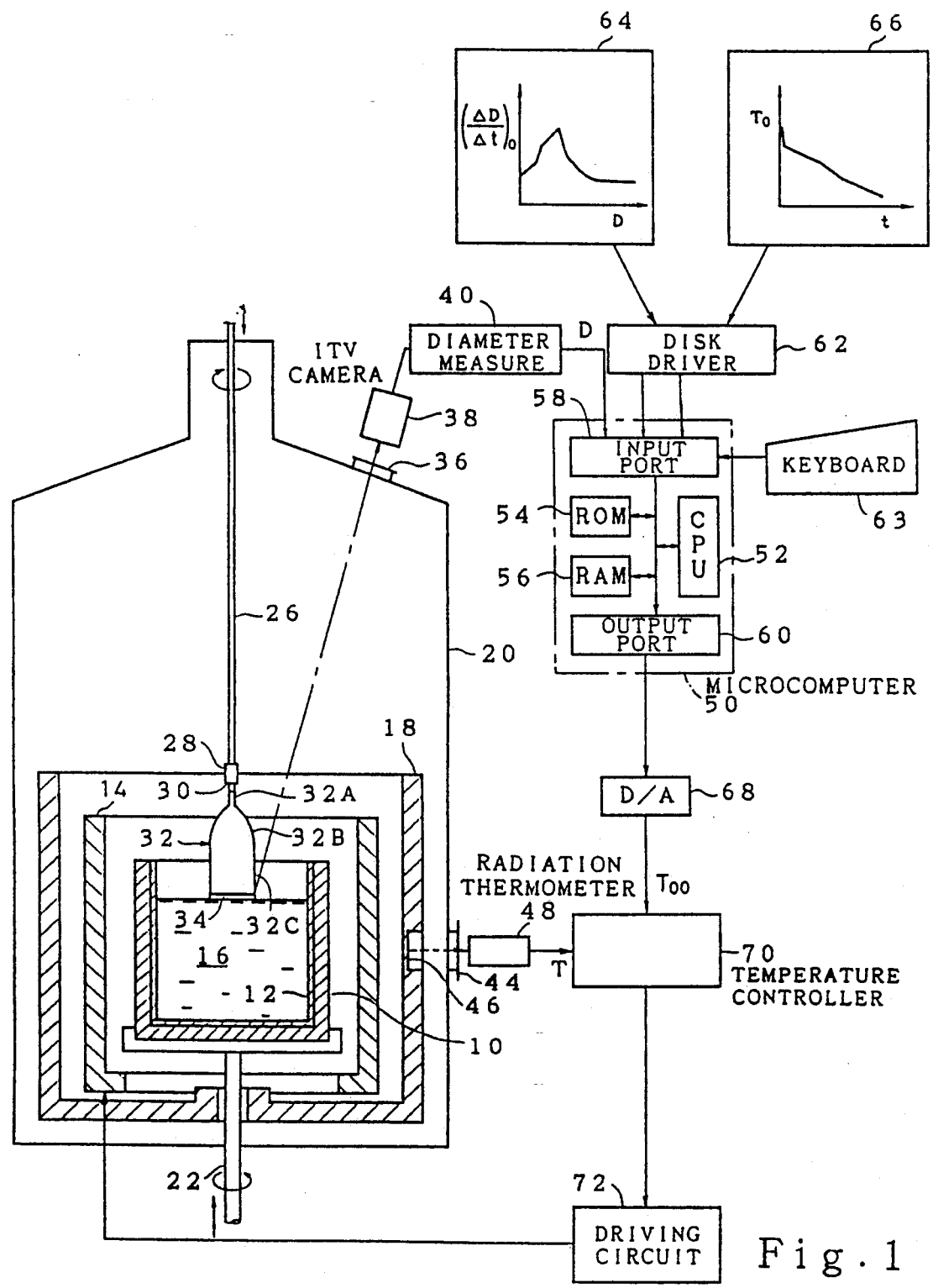

FIG. 1 shows a crystal growing apparatus using the Czochralski method to which a conical portion growth control apparatus is applied.

A mass of polysilicon crystal, contained in a quartz crucible 12 fitted into a graphite crucible 10, is heated and melted into a melt 16 by supplying electricity to a heater 14 which surrounds the graphite crucible 10. The heater 14 is surrounded by a graphite heat-insulating material 18. These components 10 to 18 are housed in a chamber 20 where the gas is emptied to a vacuum.

The graphite crucible 10 is rotated and elevated in the directions of the arrows by an unillustrated motor through a crucible rotating shaft 22 which is concentric with the graphite crucible 10. On the other hand, a seed crystal 30 is retained through a holder 28 at the bottom of a pulling shaft 26, which is concentric with the graphite crucible 10, above the graphite crucible 10.

A single crystal 32 is grown by soaking the lower end of the seed crystal 30 in the melt 16, and pulling up and rotating the lower end in the directions of the arrows. A narrow portion 32A for freeing the crystal from dislocations, a conical portion 32B for increasing the diameter of the crystal to a target diameter $D_B$ and a body portion 32C having the target diameter $D_B$ of the single crystal 32 are grown in this order.

A window 36 is formed on a shoulder portion of the chamber 20 to image a luminous ring 34 formed along an interface between the single crystal 32 and the melt 16 therethrough, and an imaging device 38 is fixed to the chamber 20 opposite to the window 36. A composite image signal output from the imaging device 38 is supplied to a diameter measurement device 40 which measures the diameter of the luminous ring 34 by image processing.

On the other hand, a window 44 is formed on a side of the chamber 20 to measure the temperature related to the melt 16 therethrough, a concave portion 46 is formed on a side of the heat-insulating member 18, and a radiation thermometer 48 is fixed to the chamber 20 opposite to the concave portion 46 through the window 44.

A target value $T_0$ of the temperature T detected by the radiation thermometer 48 is determined by a microcomputer 50.

As is well known, the microcomputer 50 is composed of a CPU 52, a ROM 54, a RAM 56, an input port 58 and an output port 60. The diameter D is output from the diameter measurement device 40 to the input port 58. Furthermore, for example, if the control mode is switched to the automatic control mode after growing the narrow portion 32A in the manual control mode, a conical portion growth start signal is supplied to the input port 58. The input port 58 is connected to a magnetic disk driver 62 and a keyboard 63. A target diameter change rate file 64 and a target temperature file 66 are read into the microcomputer 50 through the magnetic disk driver 62, and stored in the RAM 56. The target diameter change rate file 64 is, as shown in FIG. 1, a data file which expresses a target value $(\Delta D/\Delta t)0$ of the change rate of the crystal diameter D with respect to the time t as a function of the diameter D. Furthermore, the target temperature file 66 is, as shown in FIG. 1, a data file which expresses a target value T0 of the temperature of the concave portion 46 as a function of the time t.

The CPU 52 reads an initial correction value $\Delta T_0$, described below, from the keyboard 63 through the input port 58 according to a program stored in the ROM 54, reads the diameter D from the diameter measurement device 40 through the input port 58, calculates a corrected target temperature T00 with reference to the target diameter change rate file 64 and the target temperature file 66 stored in the RAM 56, and supplies the target temperature T00 to a temperature controller 70 through the output port 60 and a D/A converter 68.

The temperature controller 70 supplies electricity to the heater 14 through a driving circuit 72 so that T becomes equal to the target temperature T00 by, for example, a PID action.

Figure 2:
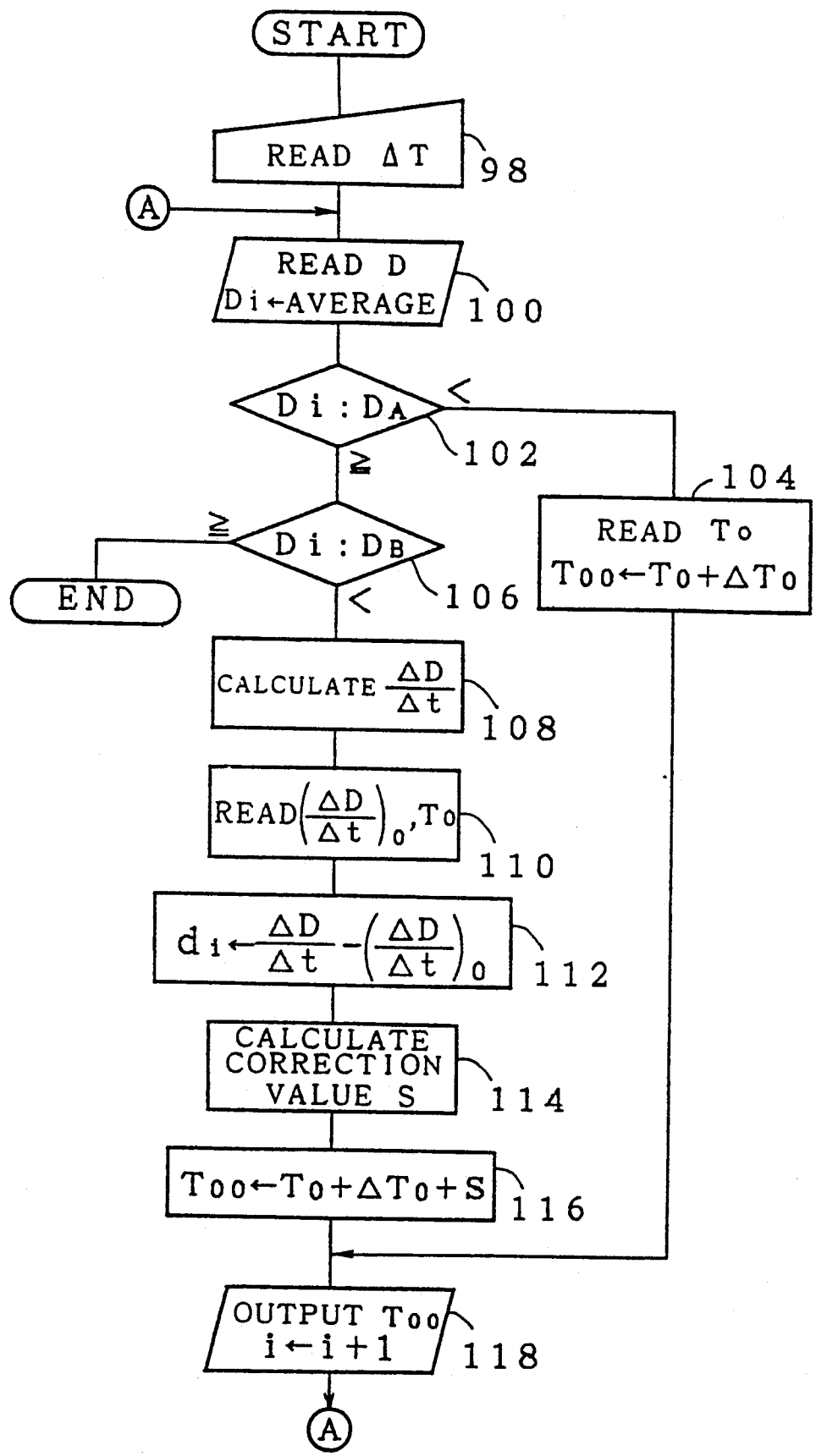

The process of the microcomputer 50 will now be described with reference to FIG. 2.

(98) A crystal diameter D and the pull-up speed at the end of the narrow portion are compared with respective standard values, the initial correction value $\Delta T0$ of a target temperature T0 is calculated based on differences between the values and input to the microcomputer 50 by operating the keyboard 63.

(100) The diameter D is read from the diameter measurement device 40 the number k of times in every fixed period $\Delta \tau$, and an average value $D_i$ of the read diameters D is calculated.

(102) It is checked whether or not the diameter $D_i$ reaches a set value $D_A$. In the case where $D_i < D_A$, since the target value of the diameter change rate is set at a relatively small value in order to prevent the disarranging of the atoms of the single crystal 32, it seems that there is not so much necessity of correcting the target temperature T0.

(104) If $D_i < D_A$, a target temperature T0 at the time $t = i\Delta t$ is read from the target temperature file 66 stored in the RAM 56, and a corrected target temperature T00 is calculated from $T0 + \Delta T0$. $\Delta t$ is $k\Delta \tau$, and an initial value of i is 1.

If $D_i \geq D_A$, (106) It is checked whether or not the diameter $D_i$ reaches a target diameter $D_B$ of the body portion 32C.

(108) If $D_i < D_B$, a change rate $\Delta D/\Delta t$ of the diameter $D_i$ with respect to time is calculated. $\Delta D$ is $(D_i - D_{i-m})/m$.

(110) A target diameter change rate $(\Delta D/\Delta t)0$ and a target temperature T0 at the time $t = i\Delta t$ are read from the target change rate file 64 and the target temperature file 66 stored in the RAM 56, respectively.

(112) $d_i = \Delta D/\Delta t - (\Delta D/\Delta t)0\cdot(1)$ is calculated.

(114) A correction value S of the target temperature T0 to improve reproducibility of the shape of the conical portion 32B without making the conical portion 32B unevener is calculated. For example, it is assumed that the correction value S is obtained by adding a proportional component, a differential component and an integral component with respect to the above $d_i$. In this case, $$S = K_P d_i + K_I \sum_{j=1}^{i} d_j \Delta t + K_D \Delta d/\Delta t.$$

$K_P$, $K_I$ and $K_D$ are constants empirically selected so as to perform the correction most effectively, and $\Delta d = d_i - d_{i-1}$.

(116) T00 is calculated from $T0 + \Delta T0 + S$.

(118) The corrected target temperature T00 is supplied to the temperature controller 70 through the D/A converter 68. The number of i is increased and the step 100 is repeated.

Figure 3:
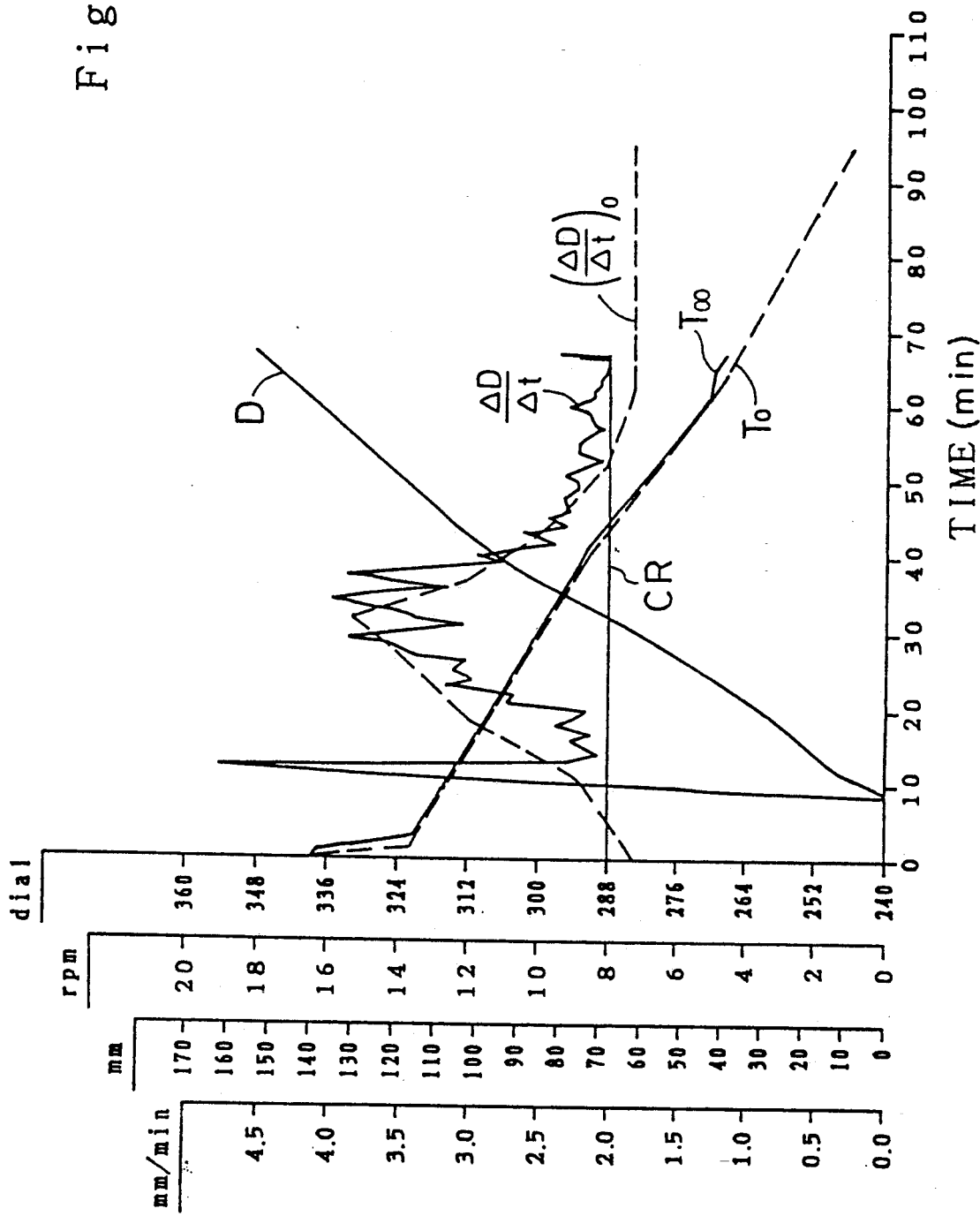
Figure 4:
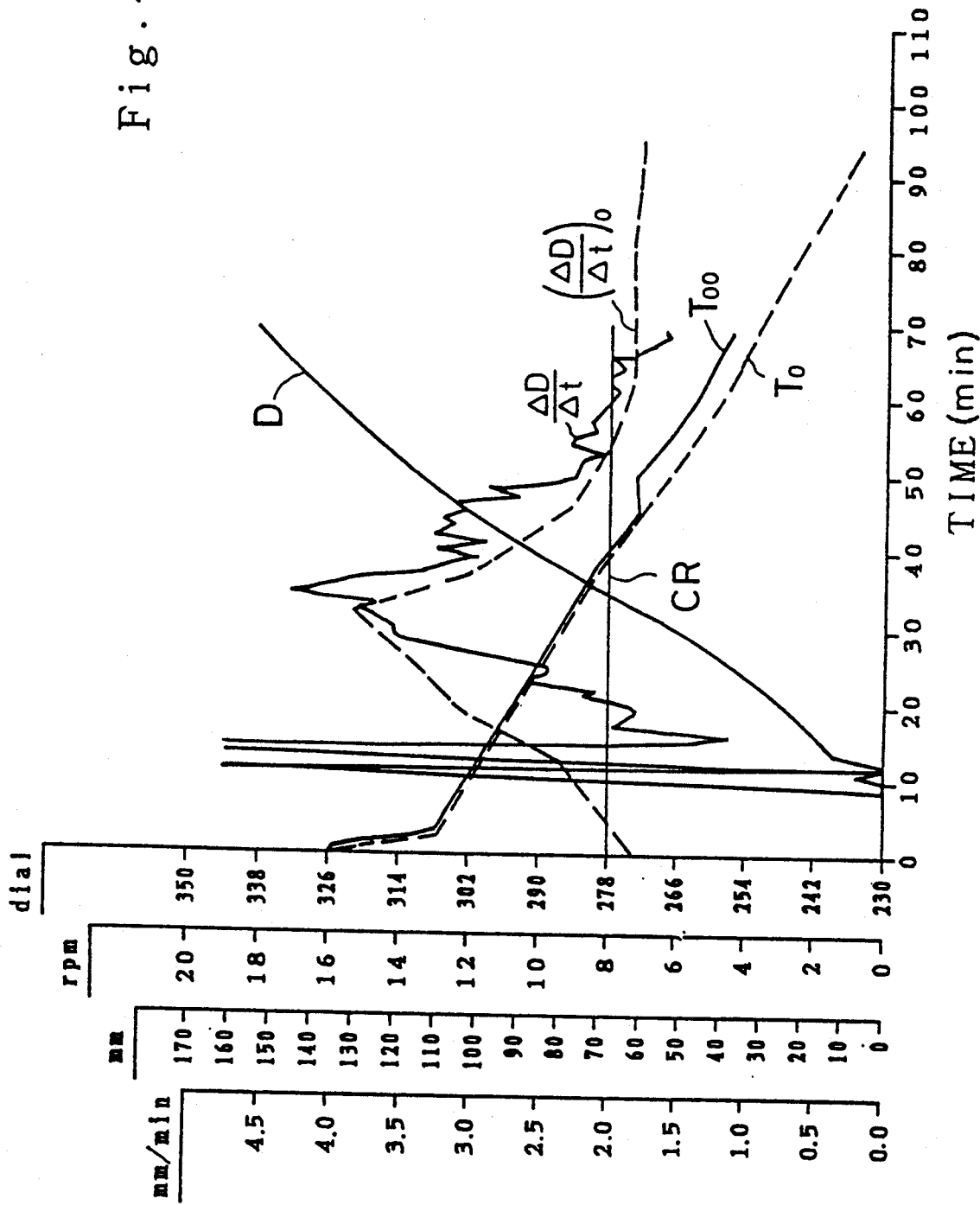

FIGS. 3 to 5 show changes of the diameter D, the diameter change rate $\Delta D/\Delta t$, the target diameter change rate $(\Delta D/\Delta t)0$, the target temperature T0 and the rotation speed CR of the quartz crucible 12 with respect to the time t (the automatic conical portion growth control is started when $t = 0$) when the conical portion 32B is actually grown by using the apparatus in this embodiment. Test conditions when the conical portion 32B is grown are as follows:

Quartz crucible 12: vertical position fixed
Pulling shaft 26: pull-up speed fixed
Temperature controller 70: PID controller
$\Delta \tau = 6$ seconds, $\Delta t = 1$ minute, $m = 2$
$D_A$: 80 mm
$D_B$: 158 mm Since hunting of the target temperature T00 occurs when $m\Delta t$ is too short and the correction is not precise when $m\Delta t$ is too long, it is important to select $m\Delta t$. A preferable range of $m\Delta t$ is 1 to 3 minutes.

Referring to FIGS. 3 to 5, the dial value is in linear relation to the temperature. T0 rapidly falls when $t < 2$ minutes in order to increase the conical portion growing speed. $T0 + \Delta T0 < T00$ when $t < 2$ minutes for the following reason. In other words, the driving circuit 72 rotates the dial by the motor so as to control the amount of electricity to be supplied to the heater 14, and if the change rate of the target temperature is too large, the rotation speed of the motor reaches the upper limit and becomes late in catching up with the change.

Referring to FIG. 3, a deviation d of the diameter change rate with respect to the target value is relatively small when $D \geq DA$. At the time $T = 60 \sim 65$ minutes, the target temperature To is corrected upward.

Referring to FIG. 4, d is relatively large at the time $t = 45 \sim 50$ minutes, and the target temperature T0 is corrected upward. When $t > 50$, the integral constant remains as a correction value, and the slopes of T0 and T00 are equal to each other.

Referring to FIG. 5, since d becomes a negative value at the time $t > 40$, the target temperature T0 is corrected downward.

The case in which conical portions 32B of 40 single crystal rods are grown in the conventional method without correcting the target temperature T0 and the case in which conical portions 32B of 40 single crystal rods are grown in this method which corrects the target temperature T0 are compared with each other The result of the comparison is as follows:

| Average length of conical portion | |
|---|---|
| conventional method: 10.7 cm | this method: 10.1 cm |
| Average deviation of length of conical portion | |
| conventional method: 1.49 | this method: 0.65 |
| Proportion of defective (number of rods with dislocation/40) | |
| conventional method: 0.45 | this method: 0.10 |

The defective means a rod which is lowered, melted in the melt and pulled up again due to dislocation.

It seems that the proportion of the defective is high in the conventional method because the actual diameter change rate $\Delta D/\Delta t$ becomes partially too large since the conical portion is shortened, the target diameter change rate $(\Delta D/\Delta t)0$ is relatively large, and reproducibility of the surface shape is low, thereby causing dislocation. On such strict conditions, the reproducibility of the surface shape is enhanced and the proportion of defectives is greatly lowered by automatically correcting the temperature as described in this embodiment.

What is claimed is:

1. A conical portion growth control method which grows a conical portion (32B) of a single crystal rod (32) by pulling said crystal rod from a melt (16) heated by a heater (14) in the Czochralski method, comprising the steps of:

presetting a target temperature value (66) related to said melt and a target value (64) of a diameter change rate of a growing portion of said crystal rod;

measuring a diameter of said growing portion (100); calculating the change rate of the diameter (108); measuring the temperature related to said melt; correcting said target temperature based on a difference between said calculated value and said target value of the diameter change rate (112~116); and controlling the amount of electricity supplied to said heater so that the measured temperature becomes equal to the corrected target temperature.

2. A control method according to claim 1, wherein said target temperature value (66) is a function of time, and said target value (64) of the diameter change rate is a function of the diameter.

3. A control method according to claim 1, wherein said temperature related to said melt is the temperature of a concave portion (46) formed on a heat-insulating material (18) surrounding said heater (14).

4. A control method according to claim 2, wherein the correction of said target temperature is performed by adding the total value of a proportional component, a differential component and an integral component related to the difference between said calculated value and said target value of the diameter change rate to said target temperature.

5. A control method according to claim 4, wherein the amount of said the electricity is controlled by performing a PID action with respect to the difference between said measured temperature and said corrected target temperature.

* * * * *